United States Patent
Ozeki et al.

(10) Patent No.: US 9,559,711 B2
(45) Date of Patent: Jan. 31, 2017

(54) A/D CONVERTER INCLUDING MULTIPLE SUB-A/D CONVERTERS

(71) Applicant: Panasonic Intellectual Property Management Co., Ltd., Osaka (JP)

(72) Inventors: Toshiaki Ozeki, Osaka (JP); Junichi Naka, Osaka (JP); Takuji Miki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/131,969

(22) Filed: Apr. 18, 2016

(65) Prior Publication Data

US 2016/0329905 A1  Nov. 10, 2016

(30) Foreign Application Priority Data

May 7, 2015  (JP) ................................ 2015-094737

(51) Int. Cl.
*H03M 1/10* (2006.01)
*H03M 1/12* (2006.01)
*H03M 1/38* (2006.01)

(52) U.S. Cl.
CPC ......... *H03M 1/1009* (2013.01); *H03M 1/1245* (2013.01); *H03M 1/38* (2013.01)

(58) Field of Classification Search
CPC ........ H03M 1/12; H03M 1/1023; H03M 1/00; H03M 1/0607; H03M 1/1009; H03M 1/10; H03M 1/1071; H03M 3/38
USPC ................................. 341/155, 158, 118, 120
See application file for complete search history.

(56) References Cited

U.S. PATENT DOCUMENTS

| | | | | | |
|---|---|---|---|---|---|
| 5,821,795 | A | * | 10/1998 | Yasuda | H03K 5/007 327/307 |
| 6,281,818 | B1 | * | 8/2001 | Miller | H03M 1/1038 341/118 |
| 7,084,792 | B2 | * | 8/2006 | Hsu | H03M 1/1023 341/118 |

(Continued)

OTHER PUBLICATIONS

N. Mehta, "Sampling Time Error Calibration for Time-Interleaved ADCs," Aug. 29, 2013, Retrieved from Internet: URL:http//repository.tudelft.nl/assets/uuid:e606b0a94273-425-86ac-11840676e03d/ms cThesisV6.pdf [retrieved on Sep. 19, 2016].

(Continued)

*Primary Examiner* — Jean B Jeanglaude
(74) *Attorney, Agent, or Firm* — McDermott Will & Emery LLP

(57) ABSTRACT

An A/D converter includes: an input buffer; N sub-A/D converters including N first sampling circuits that are connected to the input buffer, and that sample the output analog signal in respective sampling slots; a control circuit that executes calibration for the N first sampling circuits one by one; a reference A/D converter including a second sampling circuit that is connected to the input buffer, and that samples the output analog signal in the same sampling slot as the sampling slot of one first sampling circuit under execution of the calibration among the N first sampling circuits; and a third sampling circuit that is connected to the input buffer, and that samples the output analog signal in the same sampling slots as the sampling slots of the (N−1) first sampling circuits out of the execution of the calibration.

6 Claims, 13 Drawing Sheets

(56) References Cited

U.S. PATENT DOCUMENTS

| | | | | |
|---|---|---|---|---|
| 7,336,214 | B2* | 2/2008 | Krymski | H03M 1/0607 |
| | | | | 250/208.1 |
| 7,535,390 | B2* | 5/2009 | Hsu | H03M 1/1061 |
| | | | | 341/118 |
| 7,786,908 | B2* | 8/2010 | Yoshinaga | H03M 1/1023 |
| | | | | 341/118 |
| 8,519,875 | B2* | 8/2013 | Straayer | H03M 1/1057 |
| | | | | 327/517 |
| 8,587,460 | B2* | 11/2013 | Noguchi | H03M 1/0624 |
| | | | | 327/311 |
| 2006/0279445 | A1 | 12/2006 | Kinyua et al. | |
| 2013/0049999 | A1 | 2/2013 | Oshima et al. | |
| 2015/0303934 | A1* | 10/2015 | Chiu | H03M 1/1009 |
| | | | | 341/120 |

OTHER PUBLICATIONS

Extended European Search Report issued in Application No. 16165700.2 dated Oct. 5, 2016.

* cited by examiner

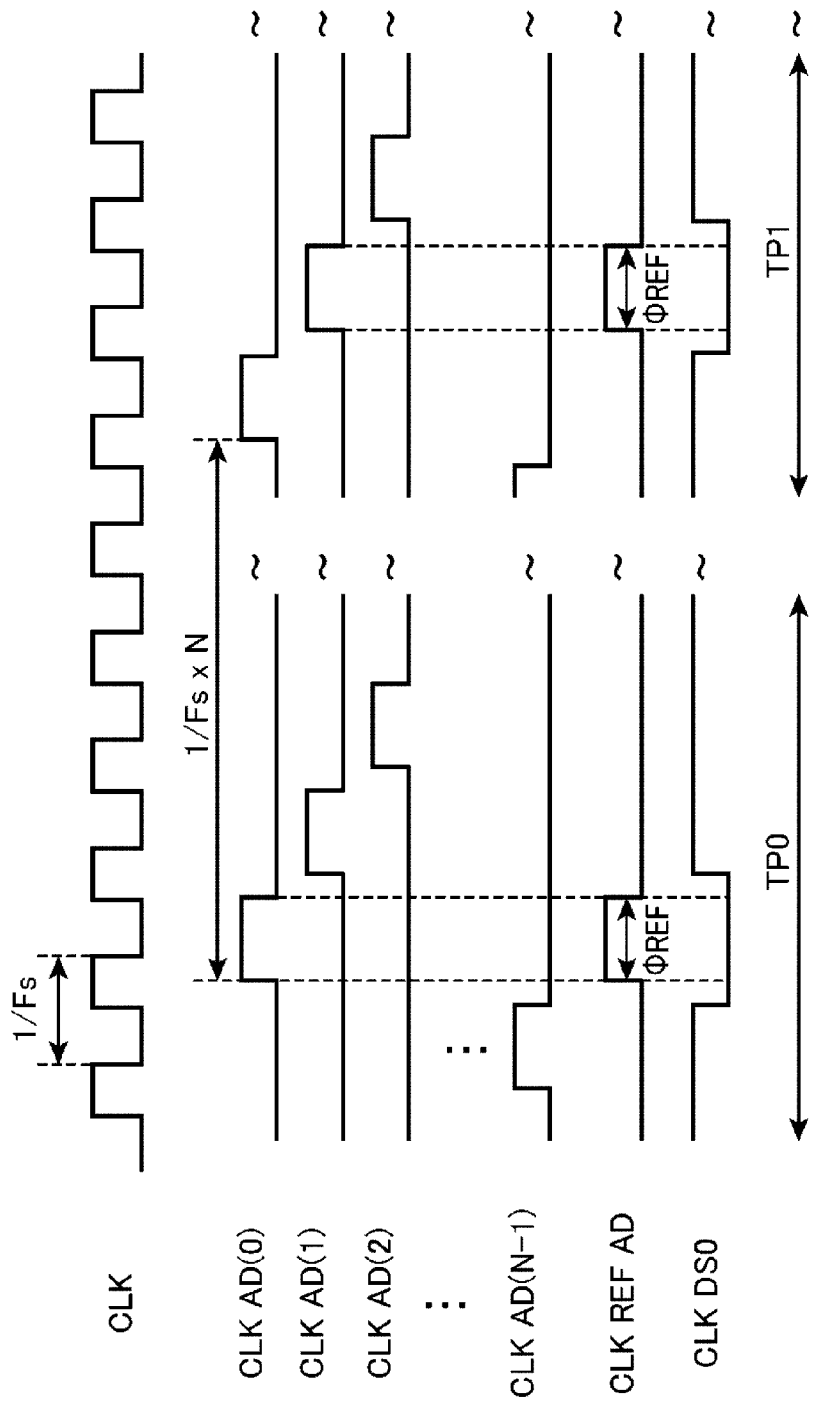

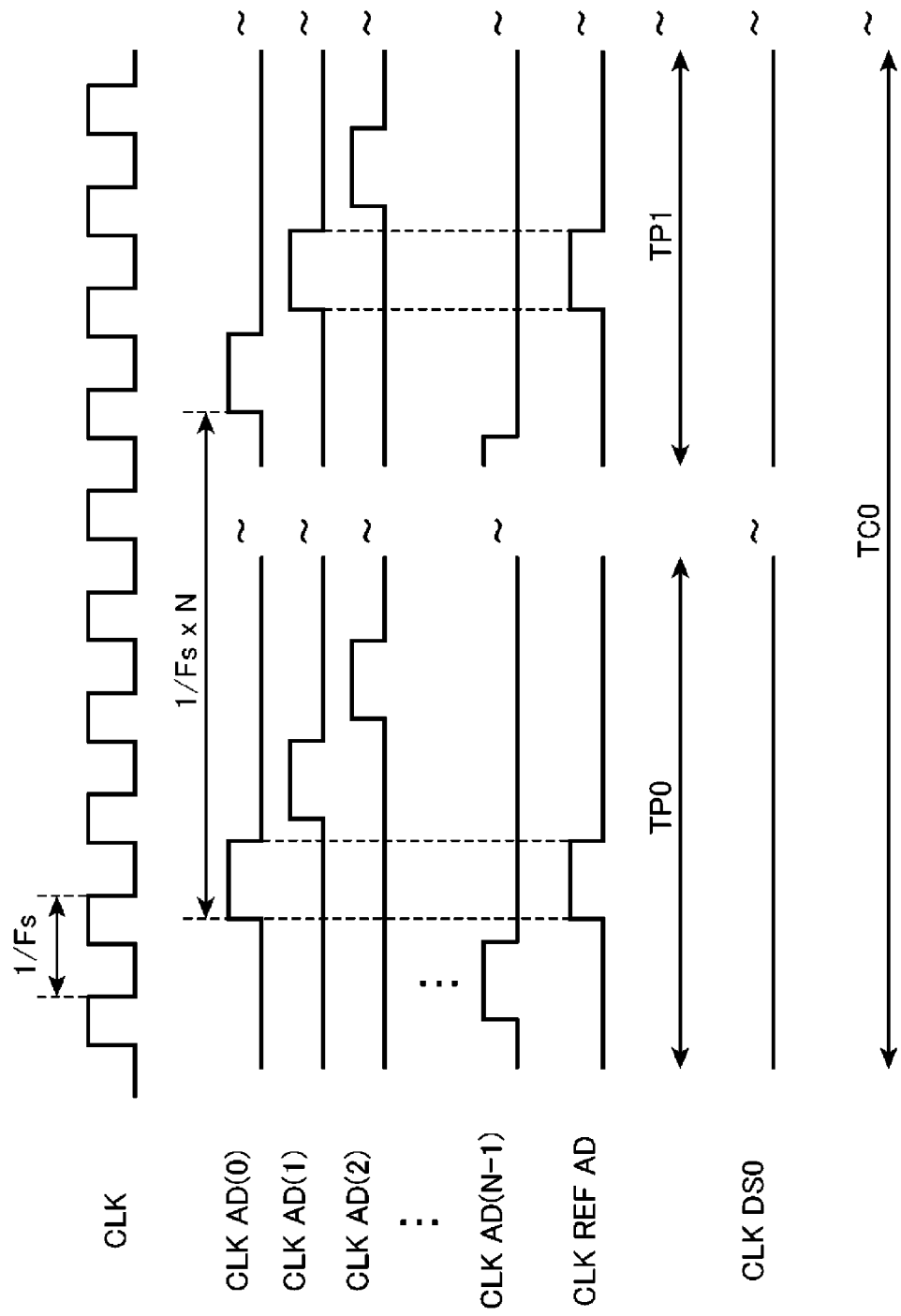

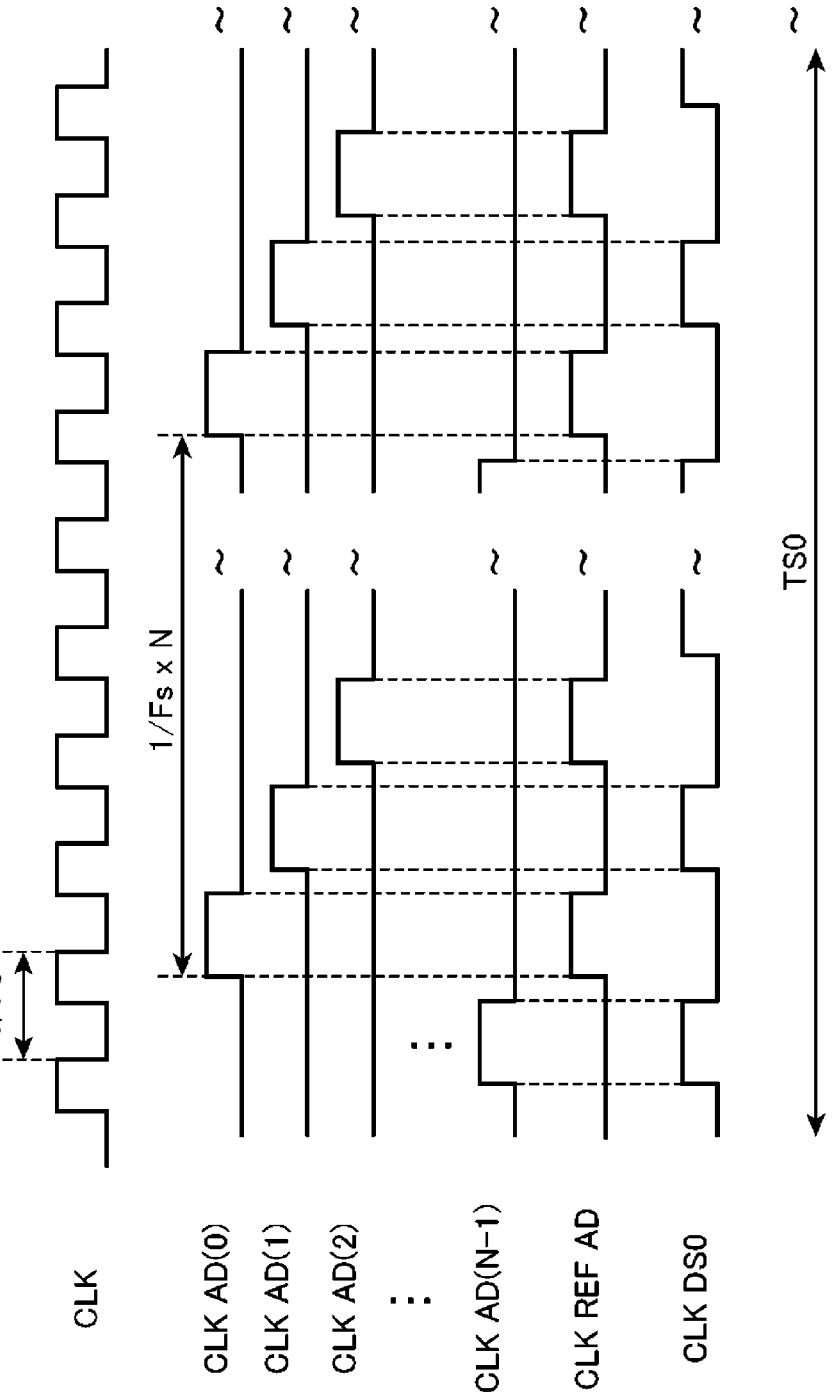

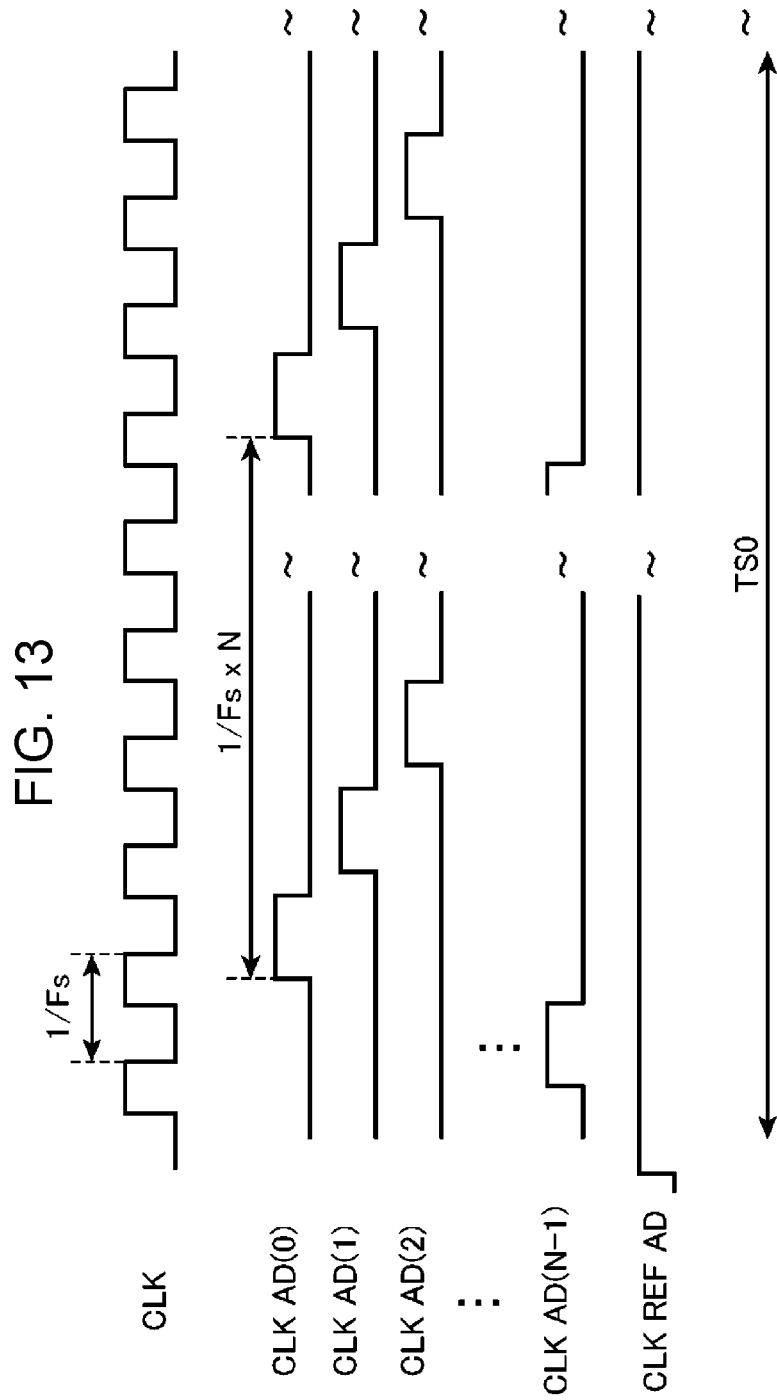

A/D CONVERTER INCLUDING MULTIPLE SUB-A/D CONVERTERS

BACKGROUND

1. Technical Field

The present disclosure relates to an analog-to-digital (A/D) converter including multiple sub-A/D converters.

2. Description of the Related Art

The A/D converters are widely used in various fields of signal processing, and the important performance indicators of the A/D converters are conversion accuracy and conversion speed. In recent years, along with rapid increase in the speed for wireless communications typified by wireless LANs, mobile phones, millimeter-wave communications, and others, there has been a demand that the A/D converters should achieve both higher conversion accuracy and higher conversion speed. However, the use of a single A/D converter with high accuracy has a limitation on the increase in the speed. For this reason, time interleaving techniques have been recently drawing attention, in which multiple A/D converters are provided in parallel and are configured to sample a signal at sampling timings with phase difference to thereby achieve an increase in the total conversion speed.

An A/D converter in a time-interleaved configuration includes N (an integer of two or more) sub-A/D converters, and achieves the conversion speed N times higher than the conversion speed of each sub-A/D converter. Provided that Fs denotes a conversion frequency of the entire time-interleaved A/D converter, the conversion frequency of each sub-A/D converter is Fs/N.

The time-interleaved configuration, however, is susceptible to mismatches among the sub-A/D converters, such as a DC offset mismatch, a signal gain mismatch indicating a difference in signal gain characteristics, and a sampling timing mismatch. For this reason, the A/D converter in the time-interleaved configuration has a problem in that the characteristics of the A/D converter as a whole are deteriorated due to these mismatches.

The DC offset mismatch occurs, for example, due to offset variations among comparators or amplifiers, or the like. For this reason, the DC offset mismatch causes spurious signals at a frequency of Fs/N*k (k=0 to N) which is not signal-dependent. Then, the signal gain mismatch causes spurious signals at a frequency of Fs/N*k±Fin (k=0 to N). Lastly, the timing mismatch occurs not only due to a difference among clock routing paths and a variation among sampling clock circuits, but also due to variations among input signal routing paths, switch circuits, sampling capacitors, and the like, and causes spurious signals at a frequency of Fs/N*k±Fin (k=0 to N) which is input-dependent.

These spurious signals deteriorate a signal-to-noise plus distortion ratio (SNDR) characteristic of the time-interleaved A/D converter. Among these mismatches, the sampling timing mismatch is problematic, because as the frequency of the input signal becomes higher, the root-square-mean noise in the voltage due to the sampling timing mismatch increases and therefore the conversion accuracy characteristics of the A/D converter are more deteriorated.

Among these mismatches, the DC offset mismatch and the signal gain mismatch have been solved with development of methods in which digital signals converted from analog signals are corrected in a digital domain. Meanwhile, various timing mismatch calibration methods have been studied such as a method of correcting a timing mismatch in the background during execution of signal processing, and a method of correcting a timing mismatch during a calibration time frame provided additionally, while suspending signal processing.

As the method of correcting the timing mismatch during execution of the signal processing, a method has been studied in which a reference A/D converter is provided in addition to the N sub-A/D converters, and is used to correct the timing mismatch, as disclosed in, for example, the specification of U.S. Pat. No. 8,736,470. In the meantime, there is another timing mismatch calibration method in which the timing mismatch is corrected in the digital domain by using only outputs of the A/D converter. Moreover, there is still another method in which the timing mismatch is corrected in an analog domain by giving feedback of a calculation result of the timing mismatch to the phase of each sampling clock, as disclosed in, for example, the specification of U.S. Patent Application Publication No. 2006/0279445.

SUMMARY

One non-limiting and exemplary embodiment provides an A/D converter that achieves improvement in the accuracy of timing mismatch calibration.

In one general aspect, the techniques disclosed here feature an A/D converter including an input buffer that receives an analog signal and outputs an output analog signal; N (an integer of two or more) sub-A/D converters including N first sampling circuits that are connected to an output side of the input buffer, and that sample the output analog signal in respective sampling slots different from each other; a reference A/D converter including a second sampling circuit that is connected to the output side of the input buffer, and that samples the output analog signal in the same sampling slot as the sampling slot of one first sampling circuit under execution of calibration among the N first sampling circuits; and a third sampling circuit that is connected to the output side of the input buffer, and that samples the output analog signal in the same sampling slots as the sampling slots of the (N−1) first sampling circuits out of the execution of the calibration.

An A/D converter according to this aspect of the present disclosure is capable of improving the accuracy of timing mismatch calibration.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 8 is a timing chart illustrating a modified example of the operation of the dummy sampling circuit;

FIG. 10 is a timing chart presenting an operation example during a calibration time frame;

FIG. 11 is a timing chart presenting an operation example during a signal processing time frame;

FIG. 13 is a timing chart presenting still another operation example during the signal processing time frame.

DETAILED DESCRIPTION

Underlying Knowledge Forming Basis of the Present Disclosure

First of all, underlying knowledge forming a basis of one aspect of the present disclosure is described.

In the case of correcting a timing mismatch in an A/D converter, adjustment of the phases of sampling clock signals makes it possible to correct overall characteristics of the entire A/D converter including a difference between routing paths of the sampling clock signals and an input signal and variations among sampling clock circuits, switch circuits, and sampling capacitors.

Figure 1:
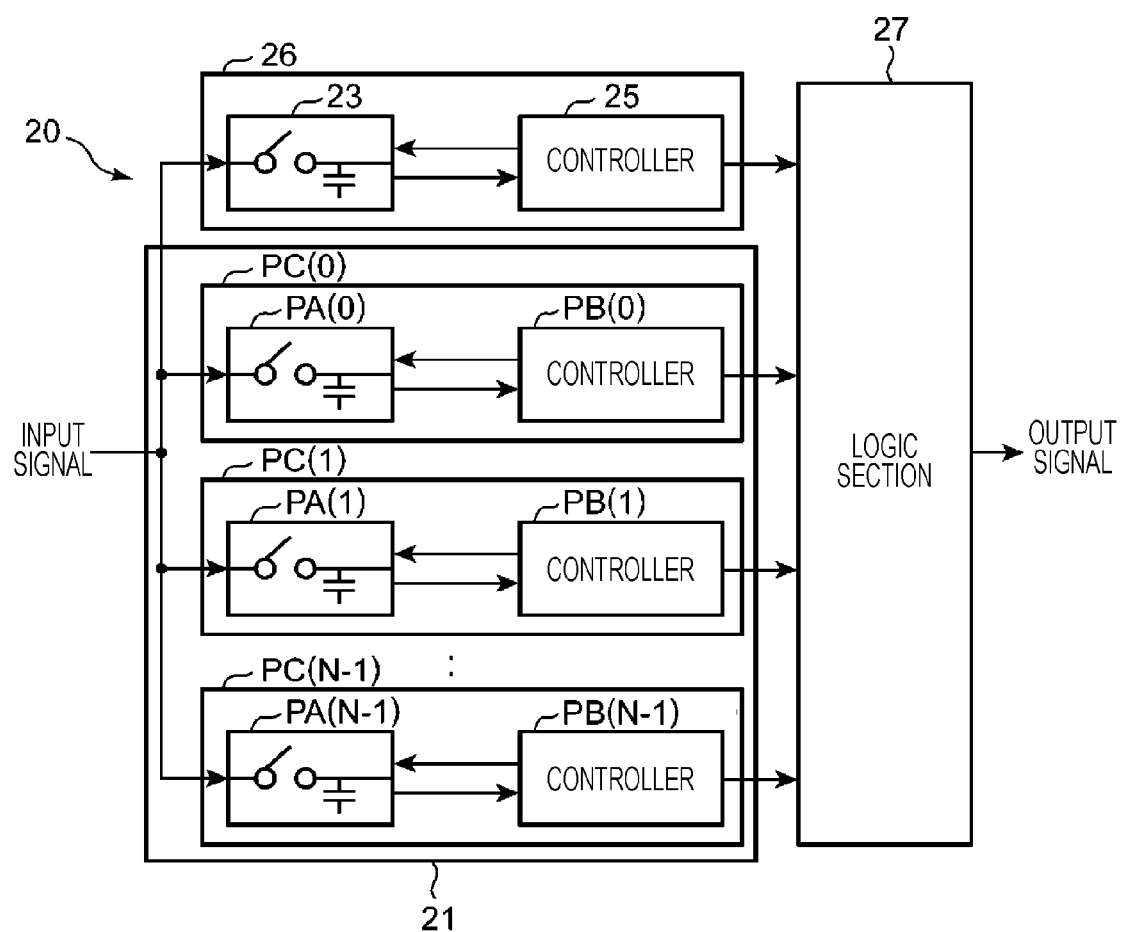
FIG. 1 is a diagram illustrating a circuit configuration of a time-interleaved A/D converter in a comparative example.

FIG. 1 is a diagram illustrating a configuration of a comparative example of a time-interleaved A/D converter 20 on which timing mismatch calibration is performed by using a reference A/D converter. The time-interleaved A/D converter 20 includes a sub-A/D converter section 21, a reference A/D converter 26, and a logic section 27.

The sub-A/D converter section 21 includes N (an integer of two or more) sub-A/D converters PC(0) to PC(N−1). The sub-A/D converters PC(0) to PC(N−1) include samplers PA(0) to PA(N−1) and controllers PB(0) to PB(N−1), respectively. Each of the samplers PA(0) to PA(N−1) samples an input signal, and includes one or more switches and one or more capacitors.

The reference A/D converter 26 includes a sampler 23 and a controller 25. The sampler 23 samples the input signal, and includes one or more switches and one or more capacitors. The logic section 27 performs operations such as correction calculator on digital output signals from the sub-A/D converter section 21 and the reference A/D converter 26, and parallel-to-serial conversion of output data. The input signal is inputted to the samplers PA(0) to PA(N−1) and the sampler 23.

Figure 2:
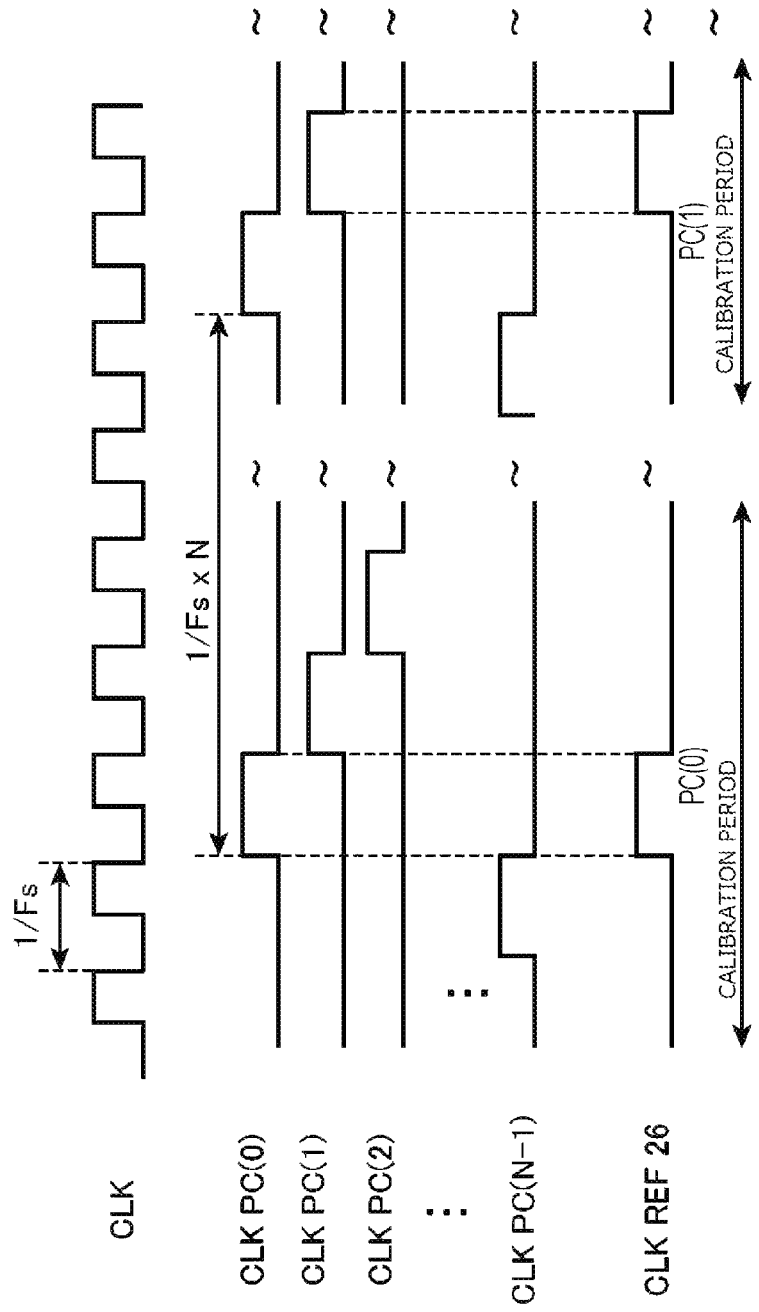
FIG. 2 is a timing chart of calibration using a reference A/D converter in the time-interleaved A/D converter in FIG. 1.

FIG. 2 is a timing chart illustrating a sampling operation of the time-interleaved A/D converter 20 in FIG. 1. An operation clock signal CLK at a frequency Fs is inputted to the time-interleaved A/D converter 20. The N sub-A/D converters PC(0) to PC(N−1) perform sampling in turn in respectively different sampling slots in response to clock signals CLK PC(0) to CLK PC(N−1) whose phases are shifted from each other.

In FIG. 2, a High period of each clock waveform indicates a sampling slot. In this High period, the switch in each of the samplers PA(0) to PA(N−1) and 23 is on. If an amplifier (specifically, an input buffer having a signal gain of 1 or larger than 1) is provided in a previous stage of the circuit illustrated in FIG. 1, the amplifier drives the capacitor while the switch is on. Meanwhile, each of the sub-A/D converters PC(0) to PC(N−1) performs an A/D conversion operation after the sampling slot. More specifically, in the sub-A/D converters PC(0) to PC(N−1), the controllers PB(0) to PB(N−1) each perform the A/D conversion operation after the sampling slot.

Timings desirable for defining sampling correspond to one cycle of the operation clock signal CLK of the time-interleaved A/D converter 20, and it is desirable that the sub-A/D converters PC(0) to PC(N−1) should preform sampling exactly during every period of 1/Fs.

Here, the reference A/D converter 26 firstly selects one of the clock signals CLK PC(0) to CLK PC(N−1) for a sampling slot of the reference A/D converter 26 based on a clock signal CLK REF 26, and samples the input signal concurrently with the sub-A/D converter corresponding to the selected clock signal. In FIG. 2, the clock signal CLK REF 26 of the reference A/D converter 26 is firstly turned to High concurrently with the clock signal CLK PC(0) of the sub-A/D converter PC(0). In other words, the sampler 23 of the reference A/D converter 26 samples the input signal concurrently with the sub-A/D converter corresponding to the selected clock signal. The controller 25 of the reference A/D converter 26 performs the A/D conversion operation by using the period other than the sampling slot.

Then, the logic section 27 compares the output data of the sub-A/D converter PC(0) corresponding to the selected clock signal and the output data of the reference A/D converter 26. Then, after the data of two or more comparison results are obtained, the value of a mismatch between the output data of the selected sub-A/D converter PC(0) and the output data of the reference A/D converter 26, or a sampling timing mismatch therebetween can be obtained by calculating, for example, an average value of the two or more comparison results.

Next, the mismatch between the output data is reduced by adjusting the phase of the selected sampling clock signal CLK PC(0) of the sub-A/D converter PC(0). Thus, the selected sampling clock signal CLK PC(0) of the sub-A/D converter PC(0) can be put in phase with the sampling clock signal CLK REF 26 of the reference A/D converter 26. Then, the target for the correction operation is switched among the clock signals CLK PC(0) to CLK PC(N−1) from one to another, and the sampling clock signals CLK PC(0) to CLK PC(N−1) of all the N sub-A/D converters PC(0) to PC(N−1) are put in phase with the clock signal CLK REF 26 of the single reference A/D converter 26. Hence, the sampling timing mismatch can be corrected.

In many cases, the system using the time-interleaved A/D converter 20 in FIG. 1 receives wideband signals with small amplitudes and needs to drive the sampling capacitors of the A/D converter at a high speed. For this reason, it is often the case that an amplifier is connected to a previous stage of the A/D converter, and the A/D converter is driven by the input signals via the amplifier.

If the N sub-A/D converters and the reference A/D converter are driven by different amplifiers to correct the timing mismatch, a timing correction with high accuracy cannot be obtained due to a variation between the amplifiers. To avoid this, it is necessary to drive the sub-A/D converter and the reference A/D converter simultaneously by using a single amplifier.

However, if the single amplifier is used, two A/D converters (sampling capacitors), namely, one sub-A/D converter and the reference A/D converter are driven in a sampling slot selected for the calibration. In contrast, only one sampling capacitor is driven in the sampling slots when the other (N−1) sub-A/D converters not targeted for the calibration are driven. As a result, in the A/D converter 20 in FIG. 1, the load impedance connected to the output of the amplifier varies between in the aforementioned two kinds of sampling slots. Due to a difference in the load impedance, an error occurs in the output band characteristics of the amplifier with the result that the output of the A/D converter has spurious signals generated at the same frequency as the timing mismatch and thus has deterioration in the conversion accuracy characteristics.

Based on the foregoing underlying knowledge, the present inventors have arrived at the idea of the following aspects of the present disclosure.

An A/D converter according to one aspect of the present disclosure includes: an input buffer that receives an analog signal and outputs an output analog signal; N (an integer of two or more) sub-A/D converters including N first sampling circuits that are connected to an output side of the input buffer, and that sample the output analog signal in respective sampling slots different from each other; a reference A/D converter including a second sampling circuit that is connected to the output side of the input buffer, and that samples the output analog signal in the same sampling slot as the sampling slot of one first sampling circuit under execution of calibration among the N first sampling circuits; and a third sampling circuit that is connected to the output side of the input buffer, and that samples the output analog signal in the same sampling slots as the sampling slots of the (N−1) first sampling circuits out of the execution of the calibration.

According to this aspect, a first sampling circuit and the second sampling circuit sample the output analog signal in the sampling slot in which the calibration is performed. Then, in the sampling slots in which the calibration is not performed, a first sampling circuit and the third sampling circuit sample the output analog signal. Thus, throughout all the sampling slots, two of the sampling circuits perform the sampling. Accordingly, the load impedance on the input buffer is always kept constant or almost constant. As a result, according to this aspect, the timing mismatch calibration can be performed with high accuracy.

In the foregoing aspect, the A/D converter may further include a sub-A/D converter including the third sampling circuit.

In the foregoing aspect, the A/D converter may be configured such that the N first sampling circuits included in the N sub-A/D converters sample the output analog signal in turn in N successive sampling slots, the one first sampling circuit under the execution of the calibration samples the output analog signal in a given sampling slot of the N successive sampling slots, the (N−1) first sampling circuits out of the execution of the calibration sample the output analog signal in the respective (N−1) sampling slots of the N successive sampling slots, the second sampling circuit included in the reference A/D converter samples the output analog signal in the given sampling slot, and the third sampling circuit samples the output analog signal in the (N−1) sampling slots.

According to this aspect, the N first sampling circuits included in the N sub-A/D converters sample the output analog signal in turn in the N successive sampling slots. The second sampling circuit included in the reference A/D converter samples the output analog signal in one of the N successive sampling slots. With this sampling, timing mismatch calibration, for example, is performed. The third sampling circuit samples the output analog signal in the (N−1) sampling slots in which the second sampling circuit does not perform sampling. With this sampling, A/D conversion signal processing, for example, is performed.

According to this aspect, two sampling circuits, that is, the first sampling circuit and the second sampling circuit, or the first sampling circuit and the third sampling circuit, always perform sampling in all the N successive sampling slots. Thus, the load impedance on the input buffer is always kept constant or almost constant throughout the N successive sampling slots. Consequently, this configuration makes it possible to perform the timing mismatch calibration with high accuracy.

In the foregoing aspect, the third sampling circuit may include two samplers, and the two samplers may sample the output analog signal alternately in a time sharing manner in the (N−1) sampling slots in which the second sampling circuit does not perform the sampling.

In this aspect, the two samplers sample the output analog signal alternately in the time sharing manner in the (N−1) sampling slots in which the second sampling circuit does not perform the sampling. Thus, the frequency at which each of the two samplers performs sampling is half of the frequency in the case where only one sampler performs all the necessary sampling. Thus, the control design of the samplers can be made easier.

In the foregoing aspect, the third sampling circuit may include a single sampler, the one sampler may include a sampling switch that performs operation to sample the output analog signal, and the sampling switch may be kept on during a time period excluding the given sampling slot in which the second sampling circuit performs the sampling.

In this aspect, the sampling switch that is included in the single sampler and performs operation to sample the output analog signal is kept on during the time period excluding the given sampling slot in which the second sampling circuit performs the sampling. Thus, the control design of the single sampler can be made easier.

An A/D converter according to another aspect of the present disclosure includes: an input buffer that receives an analog signal and outputs an output analog signal; N (an integer of two or more) sub-A/D converters including N first sampling circuits that are connected to an output side of the input buffer, and that sample the output analog signal in turn in N successive sampling slots, respectively; a reference A/D converter including a second sampling circuit that is connected to the output side of the input buffer, and that samples the output analog signal in the same sampling slot as the sampling slot of each first sampling circuit under execution of calibration during a calibration time frame in which correction on the N first sampling circuits is to be performed; and a third sampling circuit connected to the output side of the input buffer. In sampling slots out of the calibration time frame, the second sampling circuit and the third sampling circuit sample the output analog signal alternately in a time sharing manner.

In this aspect, in the sampling slot of the sub-A/D converter under the execution of the calibration during the calibration time frame, a first sampling circuit and the second sampling circuit sample the output analog signal. In each sampling slot out of the calibration time frame, the first sampling circuit and either the second sampling circuit or the third sampling circuit sample the output analog signal. Thus, the load impedance on the input buffer is made equal or almost equal between the sample slot during the calibration time frame and the sampling slot out of the calibration time frame. As a result, according to this aspect, the timing mismatch calibration can be performed with high accuracy.

In addition, the second sampling circuit and the third sampling circuit sample the output analog signal alternately in the time sharing manner. Thus, the control design of the second sampling circuit and the third sampling circuit can be made easily.

An A/D converter according to still another aspect of the present disclosure includes: an input buffer that receives an analog signal and outputs an output analog signal; N (an integer of two or more) sub-A/D converters including N first sampling circuits that are connected to an output side of the input buffer, and that sample the output analog signal in turn in N successive sampling slots, respectively; and a reference A/D converter including a second sampling circuit that is connected to the output side of the input buffer, that samples the output analog signal in the same sampling slot as the sampling slot of each first sampling circuit under execution of calibration during a calibration time frame in which correction on the N first sampling circuits is to be performed, and that samples the output analog signal in N successive sampling slots during an operation time frame other than the calibration time frame.

In this aspect, a first sampling circuit and the second sampling circuit sample the output analog signal not only in the sampling slot of the sub-A/D converter under the execution of the calibration during the calibration time frame, but also in the sampling slots out of the calibration time frame. Thus, the load impedance on the input buffer is made equal between the sampling slots during the calibration time frame, and the sampling slots, out of the calibration time frame, in which, for example, A/D conversion signal processing is performed. Consequently, according to this aspect, the timing mismatch calibration can be performed with high accuracy.

In the foregoing aspect, the second sampling circuit may include a sampling switch that performs operation to sample the output analog signal, and the sampling switch may be kept on during an operation time frame other than the calibration time frame.

In this aspect, the sampling switch of the second sampling circuit is kept on during the operation time frame other than the calibration time frame. Thus, the control design of the sampling switch of the second sampling circuit can be made easily.

Embodiment

Hereinafter, an embodiment of the present disclosure is described in details with reference to the drawings. Note that the same or corresponding elements are assigned with the same reference signs, and repetitive description thereof is omitted below.

In recent years, successive approximation register A/D converters have been drawing attention due to their high power efficiency. The following description is provided by taking a successive approximation register A/D converter as an example of a sub-A/D converter.

Figure 3:
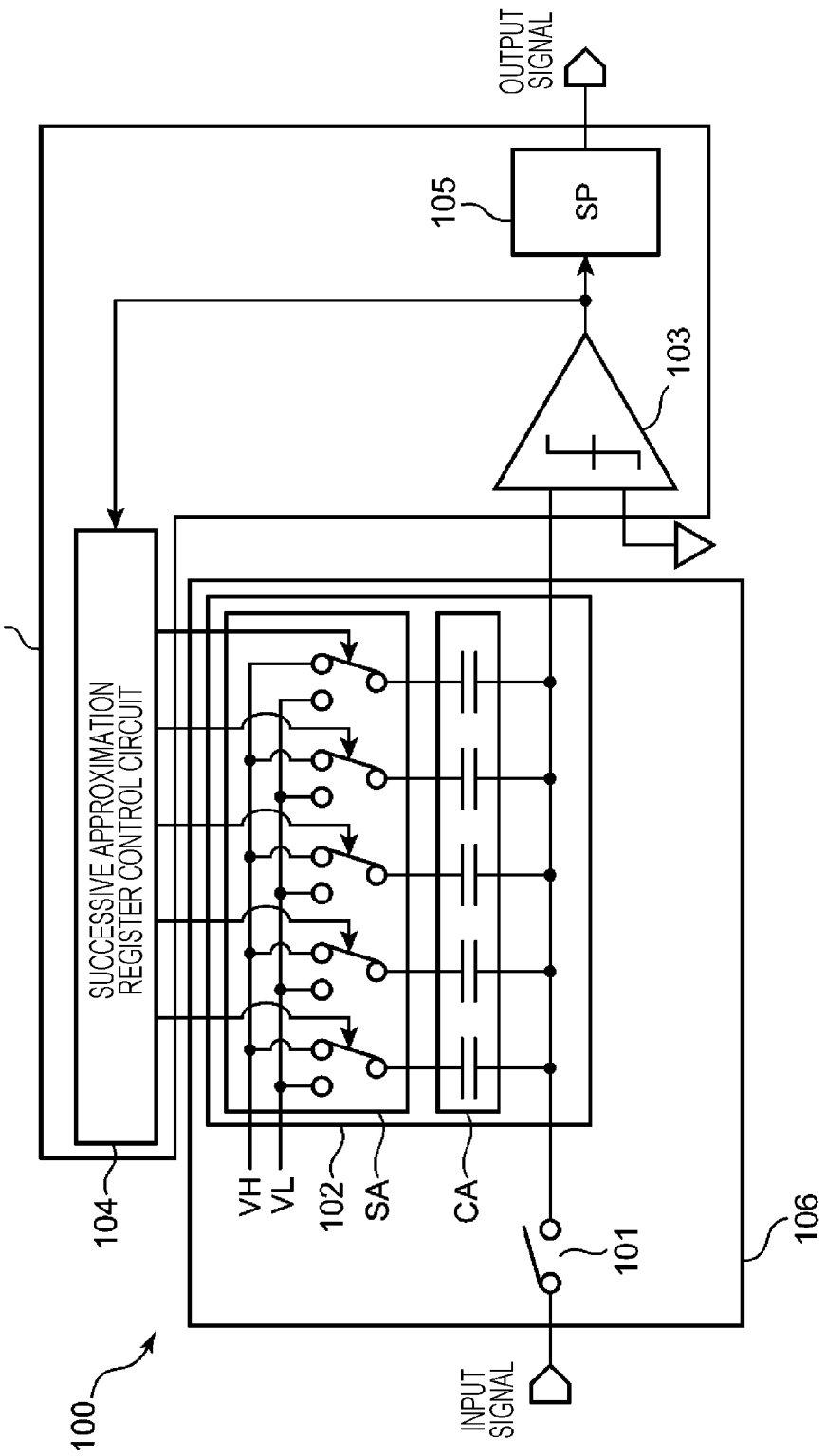
FIG. 3 is a diagram illustrating a circuit configuration of a basic successive approximation register A/D converter.

FIG. 3 is a diagram illustrating a circuit configuration of a basic successive approximation register A/D converter 100. The successive approximation register A/D converter 100 includes a sampler 106 and a controller 107. The sampler 106 includes a switch 101 and a capacitor DA converter 102. The controller 107 includes a comparator 103, a successive approximation register control circuit 104, and a serial-to-parallel converter 105.

The switch 101 samples an analog input voltage signal (hereinafter, simply referred to as an analog input signal). The capacitor DA converter 102 includes a capacitor array CA that has capacitance values sequentially weighted with a binary (a power of two) ratio, and a switch array SA that connects an analog input signal selectively to any one of reference voltages VH and VL (where VH>VL) in response to a digital input signal. The comparator 103 compares two input voltage signals. The capacitor array CA includes multiple capacitors having capacitances different from each other, for example. Among the multiple capacitors, each capacitor except the smallest capacitor has a capacitance two times larger than the capacitance of the next smaller capacitor. The successive approximation register control circuit 104 controls digital input signals to be inputted to the capacitor DA converter 102 in order to generate a comparison target voltage for the next bit based on a comparison result. The serial-to-parallel converter 105 converts the comparison results to multiple bits.

An operation of the successive approximation register A/D converter 100 in FIG. 3 is described below. First, the switch 101 is turned on, and then the switch 101 is opened after a predetermined time period. Thus, a sampling voltage signal of the analog input signal is inputted to the capacitor DA converter 102. At this time, the middle value between the reference voltages is given as an initial value to the digital input signal of the capacitor DA converter 102. In other words, the comparator 103 initially compares the input voltage signal with the voltage of (VH−VL)/2, and determines which of the input voltage signal and the voltage of (VH−VL)/2 is larger. More specifically, while the switch 101 is turned on and then is opened after the predetermined time period, the capacitor DA converter 102 samples the analog input signal. The comparator 103 compares the sampled analog input signal and the voltage of (VH−VL)/2, and outputs a determination result based on the comparison.

Thereafter, based on the comparison result, the successive approximation register control circuit 104 compares the reference voltage and the input voltage signal from the most significant bit (MSB) to the least significant bit (LSB) by operating the capacitor DA converter 102 in accordance with binary search. The serial-to-parallel converter 105 outputs the comparison determination results as A/D-converted values of multiple bits from the MSB to the LSB. In other words, the comparator 103 sequentially compares the sampled analog input signals with the reference voltage, and then outputs the determination results based on the comparisons. In this way, the sampler 106 samples the analog input signal. In addition, the sampler 106 performs a DA conversion operation. The controller 107 converts the output of the sampler 106 to a digital signal.

Figure 4:
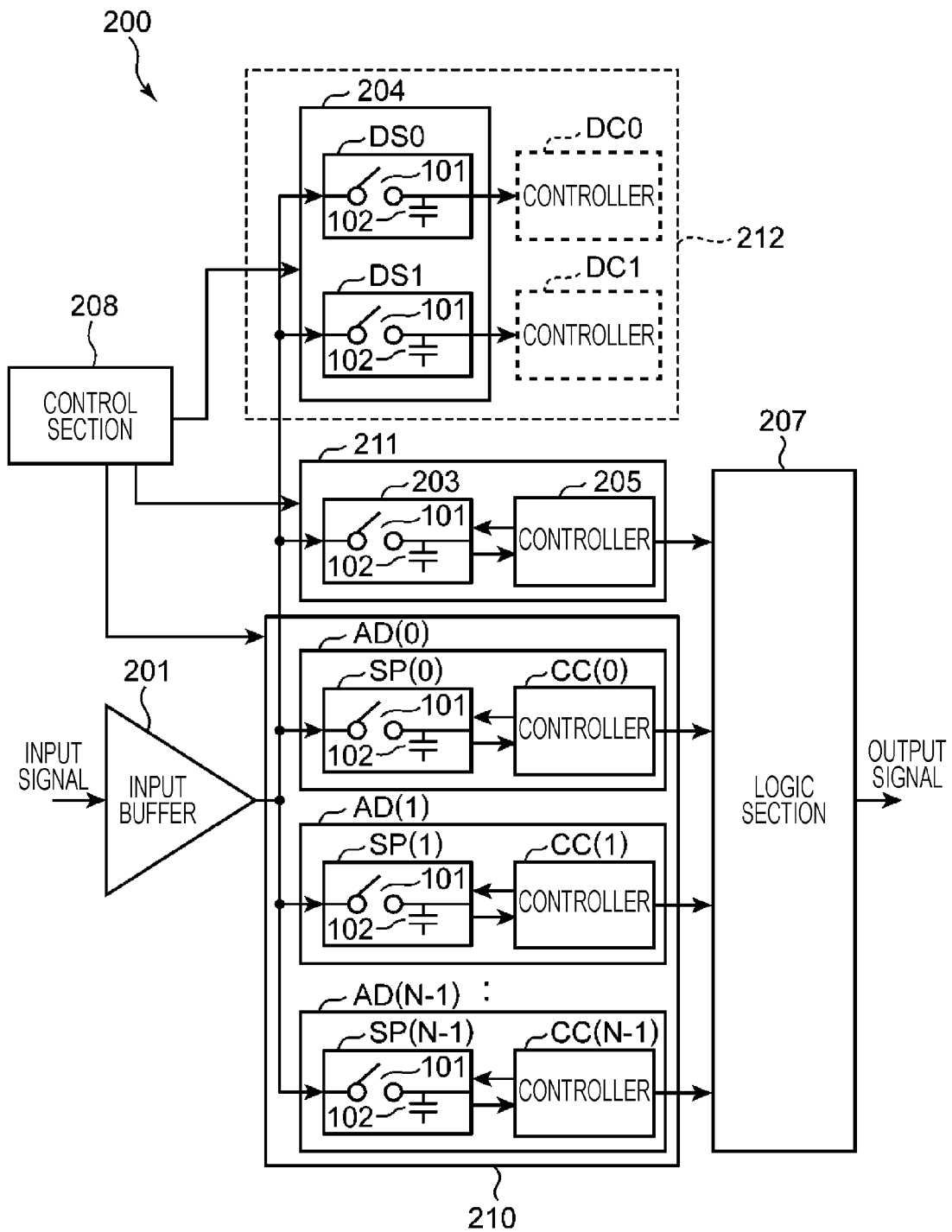
FIG. 4 is a diagram illustrating a circuit configuration of an interleaved A/D converter including a dummy sampling circuit according to an embodiment of the present disclosure.

FIG. 4 is a diagram illustrating a circuit configuration of a time-interleaved A/D converter 200 according to the embodiment of the present disclosure. The time-interleaved A/D converter 200 in FIG. 4 with an amplifier connected to an input side thereof performs A/D conversion signal processing and performs timing mismatch calibration with high accuracy in the background.

The time-interleaved A/D converter 200 includes an amplifier 201, a sub-A/D converter section 210, a reference A/D converter 211, a control section 208, a dummy sampling circuit 204, and a logic section 207.

The amplifier 201 is an operation amplifier having a high input resistance, and low output impedance, for example. The amplifier 201 receives an analog input signal inputted from outside and outputs the analog input signal as an output analog signal. In the field of wireless communications, wideband signals at several hundred MHz or higher are used as analog input signals. In addition, the analog input signal needs to be sampled at high frequencies of several GHz.

Meanwhile, many systems receive analog input signals with small amplitudes. In such a system, an amplifier having a signal gain value larger than 1 may be included as the amplifier 201. In summary, the amplifier 201 in FIG. 4 may amplify the analog input signal at a signal gain value larger than 1, or may have a signal gain of 1 and function as an input buffer without amplifying the analog input signal. In other words, the amplifier 201 is an input buffer having a signal gain of 1 or larger than 1. Thus, the amplifier 201 is also referred to as an input buffer 201 in the specification and the drawings.

The sub-A/D converter section 210 includes N (an integer of two or more) sub-A/D converters AD(0) to AD(N−1). The sub-A/D converters AD(0) to AD(N−1) include samplers SP(0) to SP(N−1) and controllers CC(0) to CC(N−1), respectively. The samplers SP(0) to SP(N−1) each have the same configuration as the sampler 106 in FIG. 3. The controllers CC(0) to CC(N−1) each have the same configuration as the controller 107 in FIG. 3. In other words, each of the sub-A/D converters AD(0) to AD(N−1) is, for example, the successive approximation register A/D converter 100 illustrated in FIG. 3.

The reference A/D converter 211 includes a sampler 203 and a controller 205. The sampler 203 has the same configuration as the sampler 106 in FIG. 3. The controller 205 has the same configuration as the controller 107 in FIG. 3. In other words, the reference A/D converter 211 is, for example, the successive approximation register A/D converter 100 illustrated in FIG. 3. In this way, the sub-A/D converters AD(0) to AD(N−1) and the reference A/D converter 211 can be configured with the same circuits.

The dummy sampling circuit 204 includes samplers DS0. DS1. The samplers DS0, DS1 each have the same configuration as the sampler 106 in the successive approximation register A/D converter 100 illustrated in FIG. 3. Note that, in FIG. 4, the dummy sampling circuit 204 includes two samplers DS0, DS1. Instead, the dummy sampling circuit 204 may include only one sampler DS0. The control section 208 may perform on/off control of the samplers DS0, DS1.

These samplers SP(0) to SP(N−1), sampler 203, and samplers DS0, DS1 are connected to an output node of the amplifier 201. Thus, the analog input signal is inputted as an output analog signal via the amplifier 201 to each of the samplers SP(0) to SP(N−1), the sampler 203, and the samplers DS0, DS1.

Figure 6:
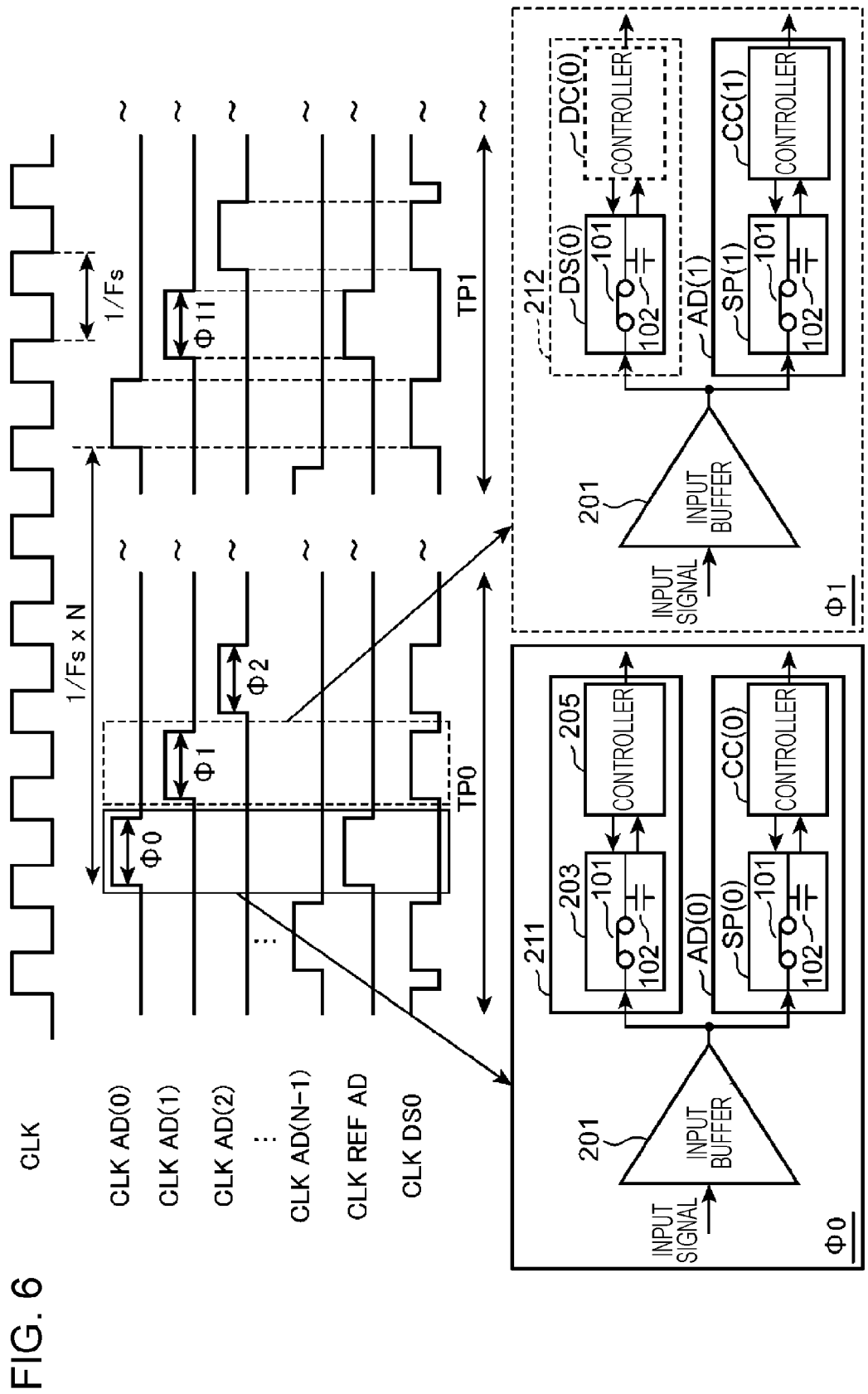
FIG. 6 presents a timing chart and circuit diagrams for explaining an operation of the dummy sampling circuit.

The control section 208 includes, for example, a phase locked loop (PLL), and generates the operation clock signal CLK at a frequency Fs (FIG. 6). The control section 208 includes, for example, a frequency divider, and performs frequency division of the operation clock signal CLK to generate clock signals CLK AD(0) to CLK AD(N−1) and CLK REF AD at a divided frequency Fs/N, and clock signal CLK DS0 (FIG. 6).

The generated clock signals CLK AD(0) to CLK AD(N−1) at the divided frequency are inputted to the sub-A/D converters AD(0) to AD(N−1), respectively. The generated clock signal CLK REF AD is inputted to the reference A/D converter 211. The generated clock signal CLK DS0 is inputted to the dummy sampling circuit 204. Hereinafter, "a clock signal at a divided frequency" is also simply referred to as "a frequency-divided clock signal" or "a clock signal".

The logic section 207 compares the output data of the sub-A/D converter section 210 and the output data of the reference A/D converter 211. Then, after the data of two or more comparison results are obtained by the logic section 207, an average value of the two or more comparison results, for example, may be calculated to obtain the value of a mismatch between the output data of the sub-A/D converter section 210 and the output data of the reference A/D converter 211, or the sampling timing mismatch therebetween. The calculation of these mismatches is carried out by, for example, the logic section 207. Then, the control section 208 adjusts the phase of the frequency-divided clock signal depending on the calculated mismatch. In other words, the logic section 207 and the control section 208 perform calibration on the samplers SP(0) to SP(N−1) of the sub-A/D converter sections 210.

In this embodiment, the samplers SP(0) to SP(N−1) are equivalent to examples of the N first sampling circuits, the sampler 203 is equivalent to an example of the second sampling circuit, and the dummy sampling circuit 204 is equivalent to an example of the third sampling circuit.

Figure 5:
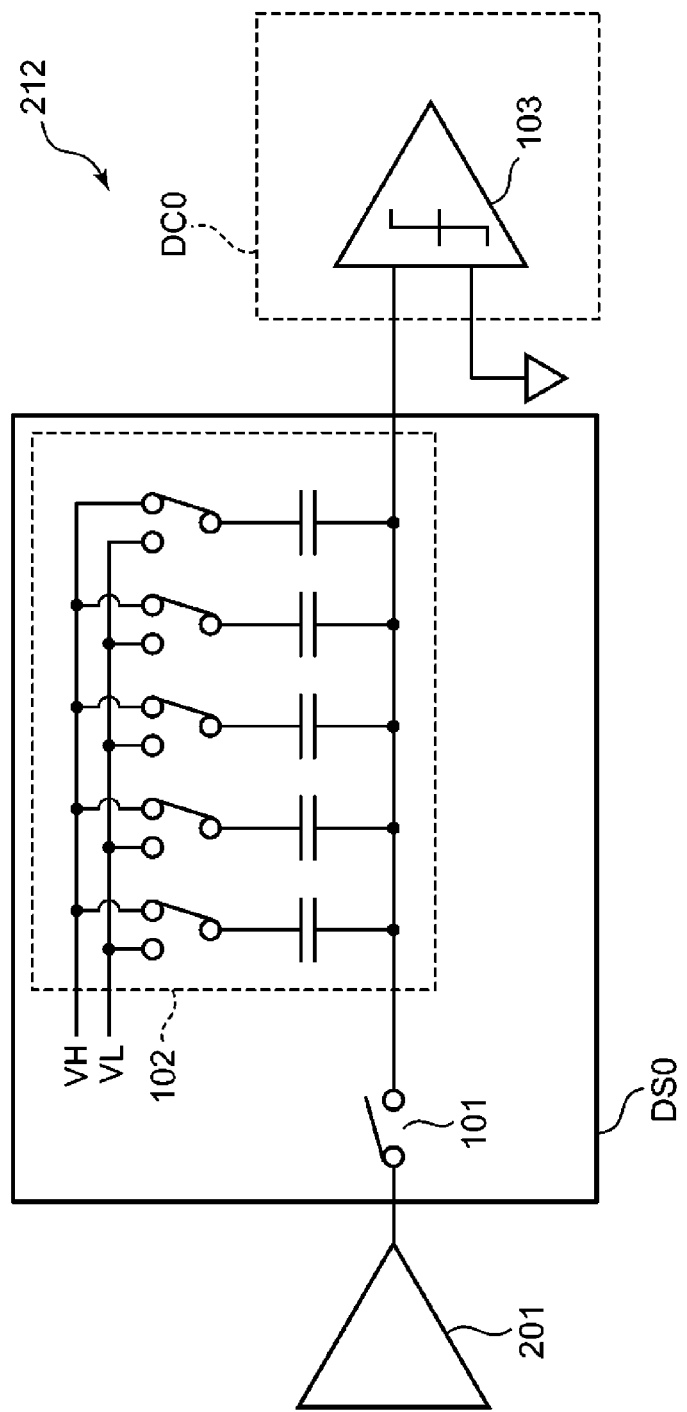
FIG. 5 is a diagram illustrating a circuit configuration of a dummy sampling circuit and a dummy A/D converter.

FIG. 5 is a diagram illustrating a circuit configuration of a dummy A/D converter 212. The time-interleaved A/D converter 200 may include the dummy A/D converter 212 including the dummy sampling circuit 204 and controllers DC0, DC1 as illustrated by a broken line in FIG. 4. Here, the sampler DS1 has the same configuration as the sampler DS0 illustrated in FIG. 5, and the controller DC1 has the same configuration as the controller DC0 illustrated in FIG. 5.

As illustrated in FIG. 5, each of the controllers DC0, DC1 of the dummy A/D converter 212 may include a wiring portion and a comparator 103 such that at least the parasitic component of the wiring for the analog input signal and the load capacitance can be equal to those of the reference A/D converter 211.

Moreover, as the dummy A/D converter 212, the same circuit as the reference A/D converter 211, namely, a successive approximation register control circuit 104 and a serial-to-parallel converter 105 may be disposed. In this case, a wiring pattern around the dummy sampling circuit 204 can be made the same or similar to a wiring pattern around the sampler 203, which makes it possible to inhibit a mismatch between the capacitance values of the capacitor DA converters 102 each of which varies depending on an area ratio of the wiring around the circuit. In this case, the logic section such as the successive approximation register control circuit 104 may be stopped from operating because the output data of the dummy A/D converter 212 is not used. This enables saving of power consumption.

Next, an operation of the time-interleaved A/D converter 200 and effects of the dummy sampling circuit 204 are described.

FIG. 6 presents a timing chart illustrating the operation of the time-interleaved A/D converter 200 and circuit diagrams for explaining conduction states of the switches 101 in sampling slots.

The frequency of the operation clock signal CLK of the time-interleaved A/D converter 200 is Fs. On the basis of this operation clock signal CLK, the N sub-A/D converters AD(0) to AD(N−1) included in the sub-A/D converter section 210 operate in response to the frequency-divided clock signals CLK AD(0) to AD(N−1) at a frequency Fs/N, respectively. The reference A/D converter 211 operates in response to the clock signal CLK REF AD. The sampler DS0 in the dummy sampling circuit 204 operates in response to the CLK DS0.

In FIG. 6, a High period of each frequency-divided clock signal indicates a sampling slot. In a High period of each clock signal, the switch 101 of the corresponding one of the samplers SP(0) to SP(N−1), 203, DS0 is on. Thus, the amplifier 201 drives the capacitor of the capacitor DA converter 102.

When two or more sampling capacitors are connected to the amplifier 201 due to an overlap between the sampling slots of two or more clock signals, the amplifier 201 may incur characteristic deterioration or the sub-A/D converters AD(0) to AD(N−1) may have noise interference therebetween. To avoid these problems, these sampling slots may be set as non-overlap clock signals as illustrated in FIG. 6.

FIG. 6 illustrates states where timing mismatches of the sub-A/D converters AD(0) and AD(1) in the sub-A/D converter section 210 are corrected. First, in a calibration period TP0 for targeting the sub-A/D converter AD(0), the calibration is performed on the sub-A/D converter AD(0). More specifically, in the calibration period TP0, the sampling clock signal CLK REF AD of the reference A/D converter 211 is turned to High in the sampling slot of the sampler SP(0) of the sub-A/D converter AD(0). Thus, the sampler 203 of the reference A/D converter 211 performs sampling concurrently with the sampler SP(0) of the sub-A/D converter AD(0).

At this time, the sub-A/D converter AD(0) and the reference A/D converter 211 sample the same analog input signal because they are connected to the same output node of the amplifier 201. For this reason, if the sampling timing of the sampler SP(0) is exactly the same as the sampling timing of the sampler 203, the signal sampled by the sampler SP(0) is the same as the signal sampled by the sampler 203. The controllers 205 and CC(0) perform the A/D conversion of these sampled signals. The sampling and the A/D conversion for correction of the sub-A/D converter AD(0) may be performed multiple times. In other words, the control section 208 may calculate an average value of mismatches in multiple output signals of the sub-A/D converter AD(0) during the calibration period TP0. Then, the control section 208 adjusts the phase of the clock signal CLK AD(0) of the sub-A/D converter AD(0) such that the output signals can have no mismatch or the mismatch of the output signals can be reduced.

As illustrated in FIG. 6, in a sampling slot φ0 of the sub-A/D converter AD(0), the amplifier 201 is in conduction via the switches 101 with the capacitor DA converter 102 of the sub-A/D converter AD(0) and the capacitor DA DA converter 102 of the reference A/D converter 211. Accordingly, the amplifier 201 has to drive the two capacitor DA converters 102.

Next, in a sampling slot φ1 of the sub-A/D converter AD(1), the switch 101 of the sampler SP(1) of the sub-A/D converter AD(1) and the switch 101 of the sampler DS(0) of the dummy sampling circuit 204 are both turned on concurrently. In other words, the control section 208 turns both of the clock signal CLK AD(1) and the clock signal CLK DS0 to High in the sampling slot φ1. During this High period, the above two switches 101 are turned on. Thus, the amplifier 201 drives the two capacitor DA converters 102.

In this way, the load impedance on the amplifier 201 can be equal or approximately equal between the sampling slot φ0 of the sub-A/D converter AD(0) (that is, in the calibration) and the sampling slot φ1 of the sub-A/D converter AD(1) (that is, in the signal processing). As a result, the amplifier 201 is expected to have equal settling characteristic in the sampling operations in both the sampling slots φ0, φ1.

Moreover, similarly, the switch 101 of the sampler DS(0) of the dummy sampling circuit 204 is turned on in all the (N−1) sampling slots when the reference A/D converter 211 is stopped from performing sampling. Thus, throughout the sampling slots when all the N sub-A/D converters AD(0) to AD(N−1) perform sampling, the load impedance placed on the amplifier 201 can be kept constant and therefore the characteristics of the amplifier 201 can be inhibited from varying between in the calibration and in the signal processing.

Subsequently, the processing in the same way is performed also in a calibration period TP1 when the clock signal CLK AD(1) of the sub-A/D converter AD(1) is corrected. In other words, the switch 101 of the sampler DS0 of the dummy sampling circuit 204 is turned on in all the (N−1) sampling slots other than a sampling slot φ11 corresponding to the clock signal CLK AD(1). Meanwhile, in all the (N−1) sampling slots other than the sampling slot φ11, the switches 101 of the sub-A/D converter AD(0) and AD(2) to AD(N−1) are turned on one after another. Then, in the sampling slot φ11, the switches 101 of the reference A/D converter 211 and the sub-A/D converter AD(1) are turned on. Thus, the characteristics of the amplifier 201 can be inhibited from varying between in the calibration and in the signal processing. In the same way, the calibration on the sub-A/D converters AD(2) to AD(N−1) is performed. Thus, even when the calibration is performed using the reference A/D converter 211 in the background of the signal processing, the timing mismatch correction result with high accuracy and the A/D conversion result with high accuracy can be obtained both together.

<Modified Example of Sampler>

In the operation of FIG. 6, the signal level for the sampler DS0 of the dummy sampling circuit 204 is turned to High in the successive sampling slots φ1, φ2 as in the clock signal CLK AD(1), the clock signal CLK AD(2), and so on. In this case, it is highly difficult to make control design of hardware and software such as to ensure falling edges of the pulse signal, ensure non-overlap periods, and do the like.

Figure 7:
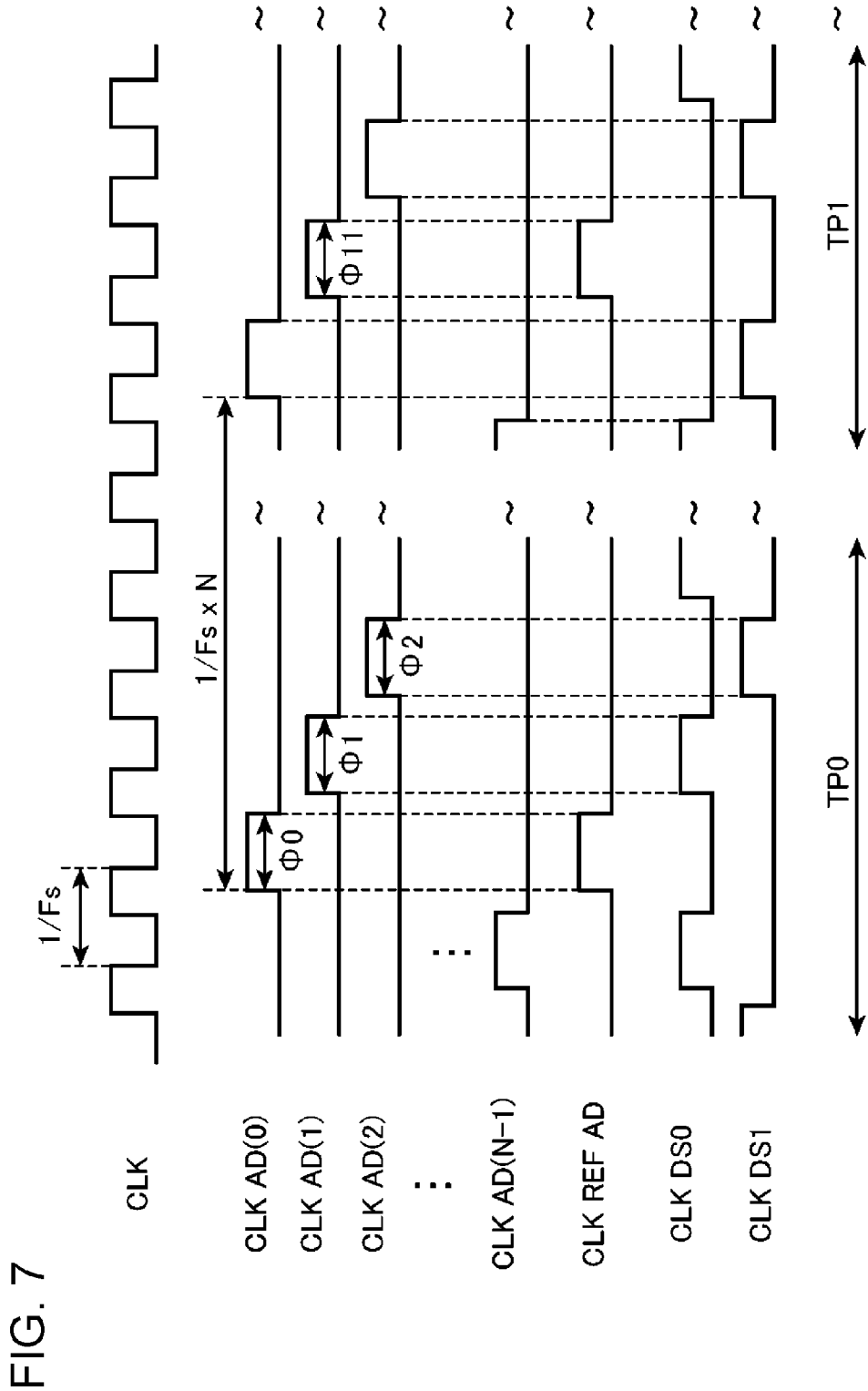
FIG. 7 is a timing chart illustrating a modified example of the operation of the dummy sampling circuit.

For this reason, as illustrated in FIG. 4, the dummy sampling circuit 204 may further include the sampler DS1 connected to the output of the amplifier 201. Then, as illustrated in FIG. 7, the sampler DS0 and the sampler DS1 may be operated alternately in the successive sampling slots. This makes it easy to make the control design of the samplers DS0, DS1.

FIG. 7 is a timing chart illustrating a case where the two samplers DS0, DS1 of the dummy sampling circuit 204 are operated.

During a correction time period TP0 for correcting the sub-A/D converter AD(0), the switch 101 of the sub-A/D converter AD(0) and the switch 101 of the reference A/D converter 211 are turned on in the sampling slot φ0 of the sub-A/D converter AD(0). As illustrated in FIG. 7, the clock signal CLK AD(0) of the sub-A/D converter AD(0) and the clock signal CLK REF AD of the reference A/D converter 211 are turned to High, and their switches 101 are on in this High period.

Next, in the sampling slot of the sub-A/D converter AD(1), the switch 101 of the sub-A/D converter AD(1) and the switch 101 of the sampler DS0 of the dummy sampling circuit 204 are turned on concurrently. As illustrated in FIG. 7, the clock signal CLK AD(1) of the sub-A/D converter AD(1) and the clock signal CLK DS0 of the sampler DS0 are turned to High, and their switches 101 are on in this High period.

Thereafter, in the sampling slot φ2 of the sub-A/D converter AD(2), the switch 101 of the sub-A/D converter AD(2) and the switch 101 of the sampler DS1 of the dummy sampling circuit 204 are turned on concurrently. As illustrated in FIG. 7, the clock signal CLK AD(2) of the sub-A/D converter AD(2) and the clock signal CLK DS1 of the sampler DS1 are turned to High, and their switches 101 are on in this High period.

As described above, in the operation in FIG. 7, the two samplers DS0, DS1 of the dummy sampling circuit 204 are turned on alternately in a time sharing manner. Thus, the load impedance on the output side of the amplifier 201 can be made constant throughout all the sampling slots of the N sub-A/D converters AD(0) to AD(N−1) with the result that the characteristics of the amplifier 201 can be inhibited from varying between in the calibration and in signal processing.

During the calibration period TP1 for correcting the sub-A/D converter AD(1), the reference A/D converter 211 performs sampling in the sampling slot φ11 of the sub-A/D converter AD(1). In the sampling slots of the other (N−1) sub-A/D converters, the two samplers DS0, DS1 of the dummy sampling circuit 204 alternately perform sampling. Thus, the same effect as in the correction time period TP0 can be obtained in the correction time period TP1.

In the configuration in FIG. 7, the sampling operation performed by the dummy sampling circuit 204 can impose the same or similar conditions on driving of the sub-A/D converters AD(0) to AD(N−1), the conditions including sampling noise of the reference A/D converter 211 and the like. In addition, since the dummy sampling circuit 204 includes the two samplers DS0, DS1, the constraints on the clock signals are relaxed, and accordingly the control design can be made easier. However, due to the increase in the number of samplers in the dummy sampling circuit 204, the configuration in FIG. 7 has a larger circuit area than the configuration in FIG. 6 in which the dummy sampling circuit 204 includes only one sampler DS0.

<Modified Example of Conduction Method of Dummy Sampling Circuit>

FIG. 8 is a timing chart illustrating an operation example of the sampler DS0 of the dummy sampling circuit 204, the operation example being different from that in FIG. 6. As illustrated in FIG. 8, the frequency-divided clock signal CLK DS0 for driving the sampler DS0 of the dummy sampling circuit 204 may be always kept High in a period except for the sampling slot φREF of the reference A/D converter 211. In other words, the switch 101 of the sampler DS0 may be always kept on except for the sampling slot φREF of the reference A/D converter 211.

In this case, in the sampling slot φREF of the reference A/D converter 211, the sub-A/D converter section 210 and the reference A/D converter 211 concurrently perform sampling. Meanwhile, in each of the sampling slots other than the sampling slot φREF, the sub-A/D converter section 210 and the dummy sampling circuit 204 concurrently perform sampling.

Accordingly, two capacitor DA converters 102 are connected to the amplifier 201 in every sampling slot. This produces such an effect that the load impedance on the amplifier 201 can be made constant or almost constant throughout all the sampling slots.

Note that the dummy sampling circuit 204 does not perform the A/D conversion operation actually. For this reason, the sampling clock noise and the like caused by the dummy sampling circuit 204 vary from those of the reference A/D converter 211. However, the influence of such characteristic variations is much smaller than that of the characteristic variations in the comparative example in FIG. 1 in which the additional amplifier is provided, and the configuration of this embodiment can produce the effect of making the load impedance on the amplifier 201 constant or almost constant.

In addition, in the operation example in FIG. 8, the clock signal CLK DS0 of the sampler DS0 does not need designing for non-overlap periods and other things as illustrated in FIG. 6. Thus, the clock signal of the sampler DS0 of the dummy sampling circuit 204 can more easily implemented.

As described above, according to this embodiment, the sampler DS0 of the dummy sampling circuit 204 performs sampling, while the timing mismatch calibration is performed using the reference A/D converter 211 in the background of the signal processing. This can make the input impedance to the time-interleaved A/D converter constant. As a result, a time-interleaved A/D converter with high accuracy can be provided even if the amplifier 201 is connected in the previous stage of the time-interleaved A/D converter.

Effects of Embodiment

Figure 9A:
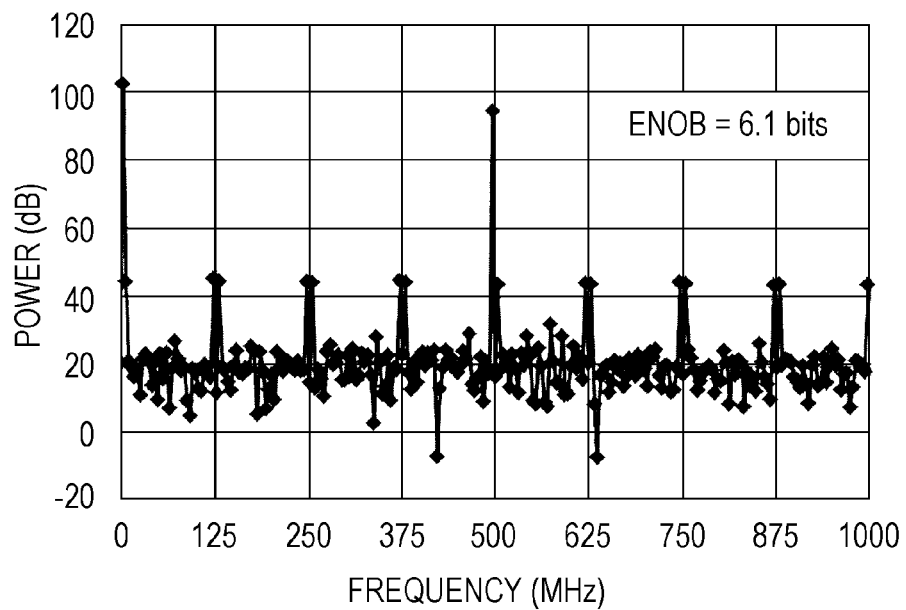
FIG. 9A is a diagram presenting a simulation result of the comparative example.
Figure 9B:
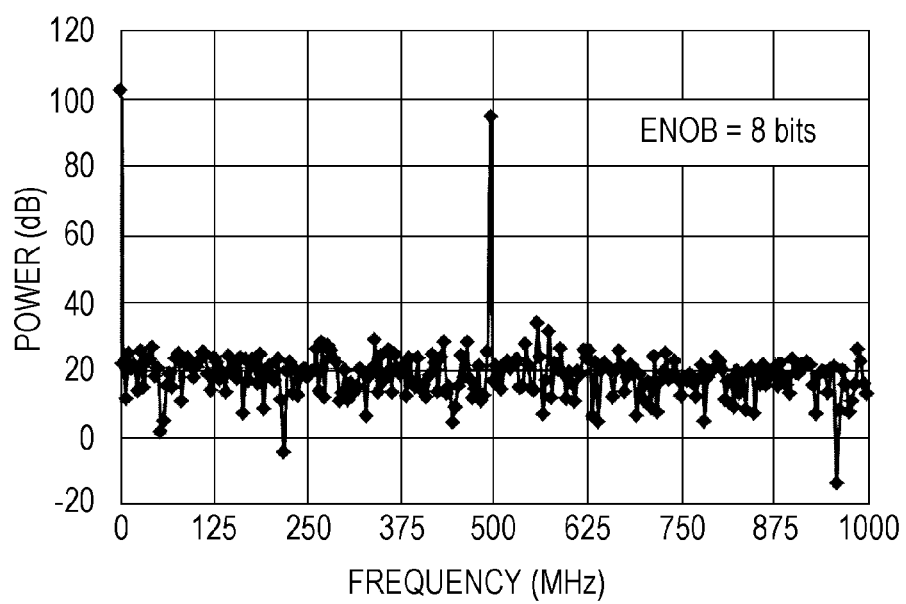
FIG. 9B is a diagram presenting a simulation result of the embodiment.

FIG. 9A is a diagram presenting a simulation result of the comparative example. FIG. 9B is a diagram presenting a simulation result of this embodiment. In FIGS. 9A and 9B, the ordinate axis indicates power (dB) and the abscissa axis indicates frequency (MHz).

FIG. 9A presents a waveform obtained by fast Fourier transform (FFT) of A/D conversion results in a case where the configuration according to the comparative example illustrated in FIG. 1 performs the signal processing simultaneously while performing the calibration on one of the N sub-A/D converters using the reference A/D converter as in FIG. 2. Meanwhile, FIG. 9B presents a waveform obtained by FFT of A/D conversion results in a case where the configuration according to this embodiment (that is, the configuration including the dummy sampling circuit 204) performs the signal processing while performing the calibration in the background. In the examples in FIGS. 9A and 9B, the simulations are performed under the settings where the resolution of each sub-A/D converter is 9 bits, the operation frequency is 125 MHz, and the number N of sub-A/D converters is 16.

In FIG. 9A, the capacitor DA converter of the reference A/D converter is driven in only one of the sampling slots of the 16 sub-A/D converters. For this reason, in this sampling slot, the load capacitance of the amplifier becomes large. As a result, the convergence of the sampling waveform takes longer time. Accordingly, an increase of spurious signals at a frequency of Fs/N*k±Fin can be observed as presented in FIG. 9A.

In FIG. 9B, the dummy sampling circuit 204 makes the load impedance on the amplifier 201 constant or almost constant throughout all the sampling slots. For this reason, the spurious signals are decreased in comparison with the case in FIG. 9A, and an improvement effect of this embodiment relative to the comparative example can be observed. In the example in FIG. 9B, an effective number of bits ENOB, which is an important characteristic of the time-interleaved A/D converter, greatly increases to 8 bits from 6.1 bits, which are scored in FIG. 9A.

<Case of Executing Timing Mismatch Calibration and A/D Conversion Signal Processing Separately in Time>

The embodiment has been explained above based on the operation in which the calibration is executed in the background during execution of the signal processing. In the case where the calibration is executed in the background, the calibration is executed by using the analog input signal as the reference signal. Accordingly, the execution of calibration requires continuous output codes of the A/D converter in a certain length, and the certain number of the data. For this reason, whether a calibration result can be fixed or not, or a time required to fix the calibration result depends on the analog input signal acquired from the system. Also, there are possible cases to which the time-interleaved A/D converter 200 of this embodiment cannot be applied, such as a case of an application for which the quality of the analog input signal cannot be guaranteed.

To address this, a calibration frame for execution of timing mismatch calibration may be provided separately in time from a signal processing time frame for execution of A/D conversion signal processing. In this case, the timing mismatch calibration may be executed by inputting a reference signal from a high-accuracy DA converter or from another system that generates the reference signal. In other words, the A/D converter 200 may further include a signal generator that generates a reference signal for execution of the calibration. Moreover, the A/D converter 200 may include an input terminal to which the reference signal for execution of the calibration is inputted from outside.

In the case where the timing mismatch calibration is executed solely without execution of the signal processing, it is unnecessary to use the output data of the sub-A/D converters not targeted for the correction while the N sub-A/D converters are calibrated in turn by using the reference A/D converter 211. For this reason, during the calibration, there is no problem related to a variation in the aforementioned load impedance on the amplifier 201.

If the dummy sampling circuit 204 is not provided, however, the amplifier 201 drives the two capacitor DA converters 102 of one of the sub-A/D converters and the reference A/D converter 211 during the calibration. On the other hand, during the signal processing, the amplifier 201 drives every one of the capacitor DA converters 102 of the N sub-A/D converters sequentially. Accordingly, the load impedance on the amplifier 201 varies between in the calibration and in the signal processing.

In many cases, high frequency response of the amplifier is nonlinear with respect to the load impedance. For this reason, due to a difference in the load impedance, the correction value of the sampling timing mismatch calculated during the calibration may not be an optimum correction value for the signal processing in some cases. To solve this problem and to obtain a high-accuracy time-interleaved A/D converter, the following method may be employed.

FIG. 10 is a timing chart presenting an operation example during a calibration frame TC0. FIG. 11 is a timing chart presenting an operation example during a signal processing time frame TS0. Here, the configuration of the A/D converter 200 that performs the operations in FIGS. 10 and 11 is a configuration in which the dummy sampling circuit 204 includes only the sampler DS0 in FIG. 4, for example.

As illustrated in FIG. 10, during the calibration frame TC0, the frequency-divided clock signals CLK AD(0) to CLK AD(N−1) are each sequentially turned to High in synchronization with one cycle of the operation clock signal CLK. Meanwhile, the frequency-divided clock signal CLK REF AD is turned to High corresponding to the High period of the frequency-divided clock signal of the correction target sub-A/D converter as in FIGS. 6 to 8. Thus, during the calibration frame TC0, the amplifier 201 drives the two capacitor DA converters 102 of the correction target sub-A/D converter and the reference A/D converter 211 in the sampling slot of the correction target sub-A/D converter. In this way, the control section 208 performs the calibration on the sub-A/D converters AD(0) to AD(N−1) one after another during the calibration time frame TC0.

As illustrated in FIG. 11, also during the signal processing time frame TS0, the frequency-divided clock signals CLK AD(0) to CLK AD(N−1) are each sequentially turned to High in synchronization with one cycle of the operation clock signal CLK. Meanwhile, the frequency-divided clock signal CLK REF AD and the clock signal CLK DS0 are alternately turned to High in synchronization of these High periods.

In this way, during the signal processing time frame TS0, the switch 101 of the sampler DS0 of the dummy sampling circuit 204 and the switch 101 of the sampler 203 of the reference A/D converter 211 are alternately turned on in every sampling slot. Thus, the amplifier 201 always drives two capacitor DA converters 102 throughout all the sampling slots of the N sub-A/D converters AD(0) to AD(N−1) during the signal processing time frame TS0.

The operations presented in FIGS. 10 and 11 can keep the load impedance on the amplifier 201 constant during both the calibration frame TC0 and the signal processing time frame TS0, and therefore an A/D conversion result with high accuracy can be obtained.

Modified Example

Figure 12:
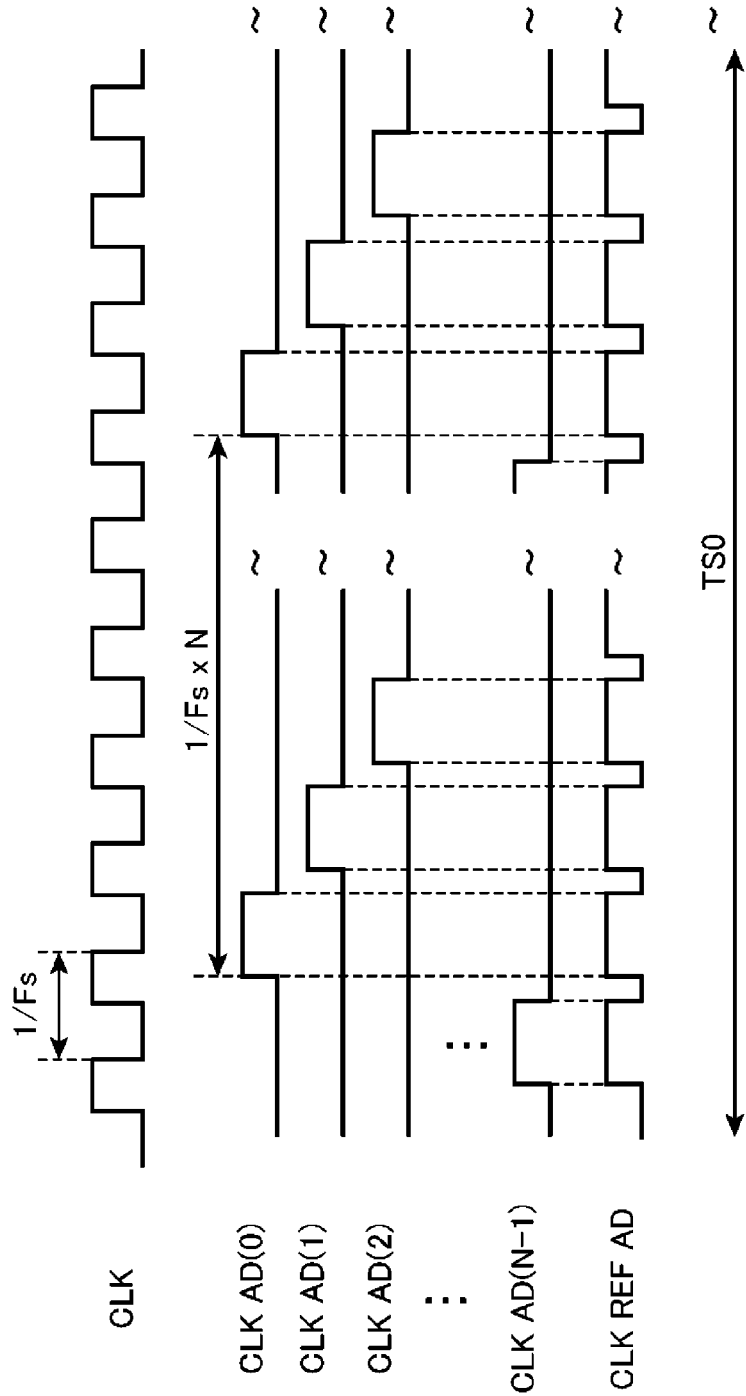
FIG. 12 is a timing chart presenting another operation example during the signal processing time frame.

FIG. 12 is a timing chart presenting another operation example during the signal processing time frame TS0. FIG. 13 is a timing chart presenting still another operation example during the signal processing time frame TS0. Here, the configuration of the A/D converter 200 that performs the operations in FIGS. 12 and 13 is the configuration in FIG. 4 excluding the dummy sampling circuit 204, for example. In this way, the dummy sampling circuit 204 may be omitted in the present disclosure. Then, operations during the calibration frame TC0 in the examples of FIGS. 12 and 13 are the same as that presented in FIG. 10.

As presented in FIG. 12, during the signal processing time frame TS0, the frequency-divided clock signals CLK AD(0) to CLK AD(N−1) are each sequentially turned to High in synchronization with one cycle of the operation clock signal CLK. Meanwhile, the frequency-divided clock signal CLK REF AD is turned to High in synchronization with these High periods.

In this way, during the signal processing time frame TS0 in FIG. 12, the sampling is performed using only the sampler 203 of the reference A/D converter 211 in all the sampling slots of the N sub-A/D converters AD(0) to AD(N−1).

Through the operation in FIG. 12, the amplifier 201 drives the two capacitor DA converters 102 of each of the sub-A/D converters and the reference A/D converter 211 during the signal processing time frame TS0, as is the case with the calibration frame TC0.

During the signal processing time frame TS0 presented in FIG. 13, the frequency-divided clock signal CLK REF AD is always kept High. In this case, the switch 101 of the sampler 203 of the reference A/D converter 211 is always kept on. As a result, also through the operation in FIG. 13, the amplifier 201 drives the two capacitor DA converters 102 of each of the sub-A/D converters and the reference A/D converter 211 during the signal processing time frame TS0, as is the case with the operation in FIG. 12. The operation presented in FIG. 13 produces an effect of making the control of the frequency-divided clock signal CLK REF AD during the signal processing time frame TS0 easier than in the operation presented in FIG. 12.

In the foregoing embodiment, the sub-A/D converters AD(0) to AD(N−1) are described as the successive approximation register A/D converters for the sake of convenience, but they should not be limited to this type of converters. The sub-A/D converters AD(0) to AD(N−1) may be any other type of A/D converters which operate discretely in response to clock signals, such as pipelined A/D converters and flash A/D converters.

In the present disclosure, all or part of the units, devices and sections or all or part of the functional blocks in the block diagrams in FIGS. 1, 3, and 4 to 6 may be implemented as one or more electronic circuits including a semiconductor device, a semiconductor integrated circuit (IC), and a large scale integration (LSI). The LSI or IC may be integrated on one chip or may be formed of an assembly of multiple chips. For example, the functional blocks other than the storage elements may be integrated on one chip. The electronic circuit is referred to as the LSI or IC herein, but the name changes depending on a degree of integration. The electronic circuit may be one named a system LSI, a very large scale integration (VLSI) or an ultra large scale integration (ULSI). For the same purpose, it is also possible to use a field programmable gate array (FPGA) which is programmed after LSI manufacturing, and a reconfigurable logic device in which a connection relationship inside the LSI is reconfigurable or in which a circuit configuration inside the LSI can be set up.

Moreover, all or part of the functions or the operations of the units, the devices, and the sections, or the functional blocks may be implemented by software processing. In this case, the software may be recorded in one or more non-transitory recording media such as a ROM, an optical disk, and a hard disk drive, and causes a processor and peripheral devices to execute particular functions in the software when the software is executed by the processor. A system or an apparatus may include one or more non-transitory recording media in which the software is recorded, a processor, and necessary hardware devices such as an interface, for example.

A time-interleaved A/D converter according to the present disclosure is capable of performing timing mismatch correction with high accuracy and performing A/D conversion processing with high accuracy in a system in which an amplifier is connected in the previous stage of the A/D converter. The present disclosure is effective not only on an application for which the calibration can be performed in the background of the signal processing, but also on a calibration method involving inputting a reference signal during a calibration time frame provided separately in time from a signal processing time frame. Hence, the present disclosure is applicable in various fields of products.

What is claimed is:

1. An A/D converter comprising:
an input buffer that receives an analog signal and outputs an output analog signal;
N (an integer of two or more) sub-A/D converters including N first sampling circuits that are connected to an output side of the input buffer, and that sample the output analog signal in respective sampling slots different from each other;
a control circuit that executes calibration for the N first sampling circuits one by one;
a reference A/D converter including a second sampling circuit that is connected to the output side of the input buffer, and that samples the output analog signal in the same sampling slot as the sampling slot of one first sampling circuit under execution of the calibration among the N first sampling circuits; and
a third sampling circuit that is connected to the output side of the input buffer, and that samples the output analog signal in the same sampling slots as the sampling slots of the (N−1) first sampling circuits out of the execution of the calibration.

2. The A/D converter according to claim 1, further comprising a sub-A/D converter including the third sampling circuit.

3. The A/D converter according to claim 1, wherein
the N first sampling circuits included in the N sub-A/D converters sample the output analog signal in turn in N successive sampling slots,
the one first sampling circuit under the execution of the calibration samples the output analog signal in a given sampling slot of the N successive sampling slots,
the (N−1) first sampling circuits out of the execution of the calibration sample the output analog signal in the respective (N−1) sampling slots of the N successive sampling slots,
the second sampling circuit included in the reference A/D converter samples the output analog signal in the given sampling slot, and
the third sampling circuit samples the output analog signal in the (N−1) sampling slots.

4. The A/D converter according to claim 3, wherein
the third sampling circuit includes two samplers, and
the two samplers sample the output analog signal alternately in a time sharing manner in the (N−1) sampling slots in which the second sampling circuit does not perform sampling.

5. The A/D converter according to claim 3, wherein
the third sampling circuit includes a single sampler,
the sampler includes a sampling switch that performs operation to sample the output analog signal, and
the sampling switch is kept on in a time period excluding the given sampling slot in which the second sampling circuit performs sampling.

6. An A/D converter comprising:
an input buffer that receives an analog signal and outputs an output analog signal;
N (an integer of two or more) sub-A/D converters including N first sampling circuits that are connected to an output side of the input buffer, and that sample the output analog signal in respective sampling slots different from each other during a calibration time frame in which calibration for the N first sampling circuits is to be executed and during an operational time frame other than the calibration time frame;
a control circuit that executes the calibration of the N first sampling circuits one by one;
a reference A/D converter including a second sampling circuit that is connected to the output side of the input buffer, and that samples the output analog signal in the same sampling slot as the sampling slot of each first sampling circuit under execution of the calibration during the calibration time frame; and
a third sampling circuit connected to the output side of the input buffer, wherein
the second sampling circuit and the third sampling circuit sample the output analog signal alternately in a time sharing manner in the sampling slots in which the N first sampling circuits sample the output analog signal during the operational time frame.

* * * * *